United States Patent
Miyazawa et al.

(10) Patent No.: US 8,608,297 B2
(45) Date of Patent: Dec. 17, 2013

(54) PIEZOELECTRIC ELEMENT, LIQUID EJECTING HEAD, AND LIQUID EJECTING APPARATUS

(75) Inventors: Hiromu Miyazawa, Azumino (JP); Takayuki Yonemura, Suwa (JP); Koichi Morozumi, Shiojiri (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 13/352,494

(22) Filed: Jan. 18, 2012

(65) Prior Publication Data
US 2012/0182361 A1   Jul. 19, 2012

(30) Foreign Application Priority Data
Jan. 19, 2011  (JP) .................. 2011-009280

(51) Int. Cl.
*B41J 2/045* (2006.01)
*H01L 41/04* (2006.01)
*H01L 41/18* (2006.01)
*H01L 41/187* (2006.01)
*C04B 35/495* (2006.01)
*C04B 35/00* (2006.01)

(52) U.S. Cl.
USPC ... 347/71; 310/311; 252/62.9 R; 252/62.9 PZ

(58) Field of Classification Search
USPC .......... 347/68; 310/311; 252/62.9 PZ, 62.9 R
See application file for complete search history.

(56) References Cited

U.S. PATENT DOCUMENTS

| 7,586,234 | B2 * | 9/2009 | Miyazawa et al. | 310/311 |
| 2005/0213020 | A1 * | 9/2005 | Takeda et al. | 349/182 |
| 2010/0308692 | A1 * | 12/2010 | Kobayashi et al. | 310/339 |
| 2011/0074249 | A1 * | 3/2011 | Sakashita et al. | 310/339 |

FOREIGN PATENT DOCUMENTS

JP    2001-223404    8/2001

OTHER PUBLICATIONS

Wikipedia Article: Rare Earth Elements, listing of elements.*
Wikipedia Article: Zinc, paragraph 1.*

* cited by examiner

*Primary Examiner* — Lisa M Solomon
(74) *Attorney, Agent, or Firm* — Workman Nydegger

(57) ABSTRACT

A piezoelectric element comprises a piezoelectric layer consisting a complex oxide having a perovskite structure containing bismuth and iron and electrodes provided to the piezoelectric layer. The complex oxide further contains a first dopant element that is at least one of magnesium and zinc and a second dopant element that is cerium.

4 Claims, 13 Drawing Sheets

BiFeO₃

BiFeO₃+Bi_defect

PIEZOELECTRIC ELEMENT, LIQUID EJECTING HEAD, AND LIQUID EJECTING APPARATUS

CROSS-REFERENCE TO RELATED APPLICATIONS

The entire disclosure of Japanese Patent Application No. 2011-009280, filed Jan. 19, 2011 is expressly incorporated by reference.

BACKGROUND

1. Technical Field

The present invention relates to a liquid ejecting head and a liquid ejecting apparatus, each including a pressure generating chamber communicating with a nozzle aperture and a piezoelectric element that includes a piezoelectric layer and electrodes applying a voltage to the piezoelectric layer and functions to change the pressure in the pressure generating chamber, and relates to the piezoelectric element.

2. Related Art

Some piezoelectric actuators used in liquid ejecting heads include a piezoelectric element having a structure in which a piezoelectric layer made of a piezoelectric material capable of electromechanical conversion, such as a crystallized dielectric material, is disposed between two electrodes. Ink jet recording heads are a typical type of liquid ejecting head. An ink jet recording head includes a vibration plate defining a part of a pressure generating chamber communicating with nozzle apertures through which ink droplets are ejected. In the ink jet recording head, a piezoelectric element deforms the vibration plate to apply a pressure to the ink in the pressure generating chamber, thereby ejecting ink droplets through the nozzle apertures.

The piezoelectric material (piezoelectric ceramic) used for forming the piezoelectric layer of such a piezoelectric element is required to have high piezoelectric properties, and a typical example of the piezoelectric material is lead zirconate titanate (PZT) (JP-A-2001-223404).

On the other hand, it is desirable to reduce lead from piezoelectric materials, from the viewpoint of environmental protection. An exemplary lead-free piezoelectric material is $BiFeO_3$, which has a perovskite structure expressed by $ABO_3$. In the $ABO_3$ structure, A represents the A site and has 12 oxygen ligands, and B represents the B site and has 6 oxygen ligands. However, for example, $BiFeO_3$-based piezoelectric materials are less insulating and liable to cause leakage current. If leakage current is liable to occur, the material is likely to crack when it is used while a high voltage is applied, and is therefore difficult to use in a liquid ejecting head. Accordingly, piezoelectric materials used in piezoelectric elements are required to have a high insulation value of $1\times10^{-3}$ $A/cm^2$ or less in use, for example, at a typical driving voltage of 25 V.

This issue arises not only in ink jet recording heads, but also in other liquid ejecting heads that eject droplets other than ink, and piezoelectric elements used for applications other than piezoelectric elements have the same issue. Furthermore, leakage current results in a serious problem that the energy consumption of the piezoelectric element is increased when the piezoelectric element is used as a sensor. It is desirable that leakage current be low as well in piezoelectric elements used for piezoelectric sensors, infrared sensors, thermal sensors and pyroelectric sensors that are used at an applied voltage of, for example, 1 V or less.

SUMMARY

An advantage of some aspects of the invention is that it provides a liquid ejecting head, a liquid ejecting apparatus and a piezoelectric element whose environmental load is reduced, and whose insulation value is increased to suppress leakage current.

According to an aspect of the invention, a liquid ejecting head is provided which includes a pressure generating chamber communicating with a nozzle aperture and a piezoelectric element. The piezoelectric element includes a piezoelectric layer and electrodes disposed on the piezoelectric layer. The piezoelectric layer is made of a complex oxide having a perovskite structure containing bismuth and iron. The complex oxide contains a first dopant element and a second dopant element. The first dopant element is at least one of magnesium and zinc, and the second dopant element is cerium.

This structure can suppress the occurrence of leakage current and achieve a piezoelectric element that can exhibit a high insulation value, and, thus, the liquid ejecting head can exhibit high durability. In addition, since the piezoelectric material does not contain lead, the environmental load of the liquid ejecting head can be reduced.

Preferably, the A site contains bismuth and the second dopant element, and the B site contains iron and the first dopant element.

In this instance, the A site may have a defect, and the B site contains bismuth.

Preferably, the complex oxide further contains barium titanate. Thus, the liquid ejecting head has a piezoelectric element exhibiting a still higher piezoelectric property (distortion).

According to another aspect of the invention, a liquid ejecting apparatus including the above-described liquid ejecting head is provided.

The liquid ejecting apparatus includes the highly insulating piezoelectric element in which leakage current can be suppressed, and thus exhibits high durability. In addition, since the piezoelectric material does not contain lead, the environmental load of the liquid ejecting apparatus can be reduced.

According to still another aspect of the invention, a piezoelectric element is provided which includes a piezoelectric layer made of a complex oxide and electrodes disposed on the piezoelectric layer. The complex oxide has a perovskite structure containing bismuth and iron, and contains a first dopant element and a second dopant element. The first dopant element is at least one of magnesium and zinc, and the second dopant element is cerium.

This structure can suppress leakage current and achieve a piezoelectric element that can exhibit a high insulation value. In addition, since the piezoelectric material does not contain lead, the environmental load of the piezoelectric element can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
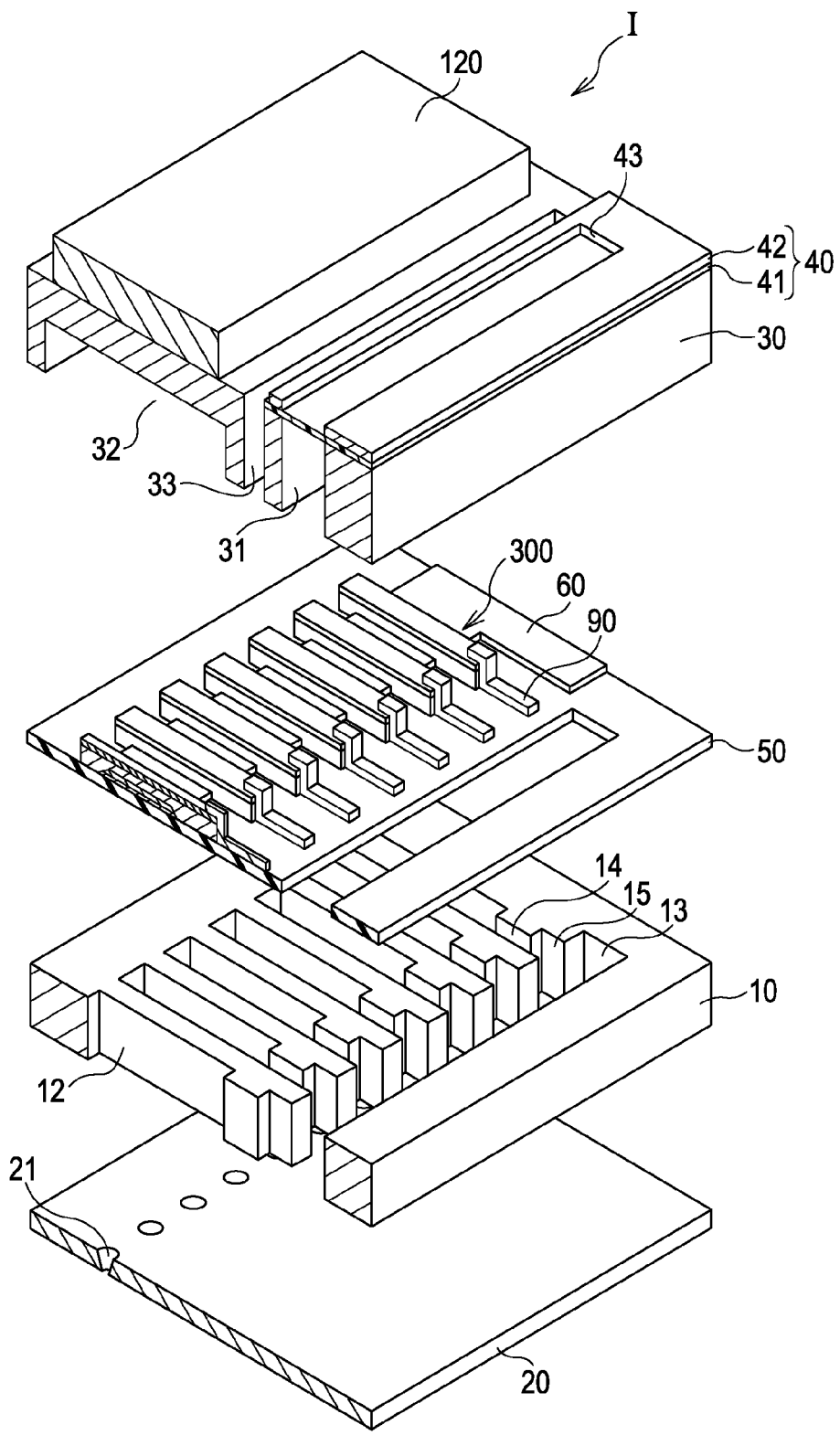
FIG. 1 is a schematic exploded perspective view of a recording head according to an embodiment of the invention.
Figure 2:
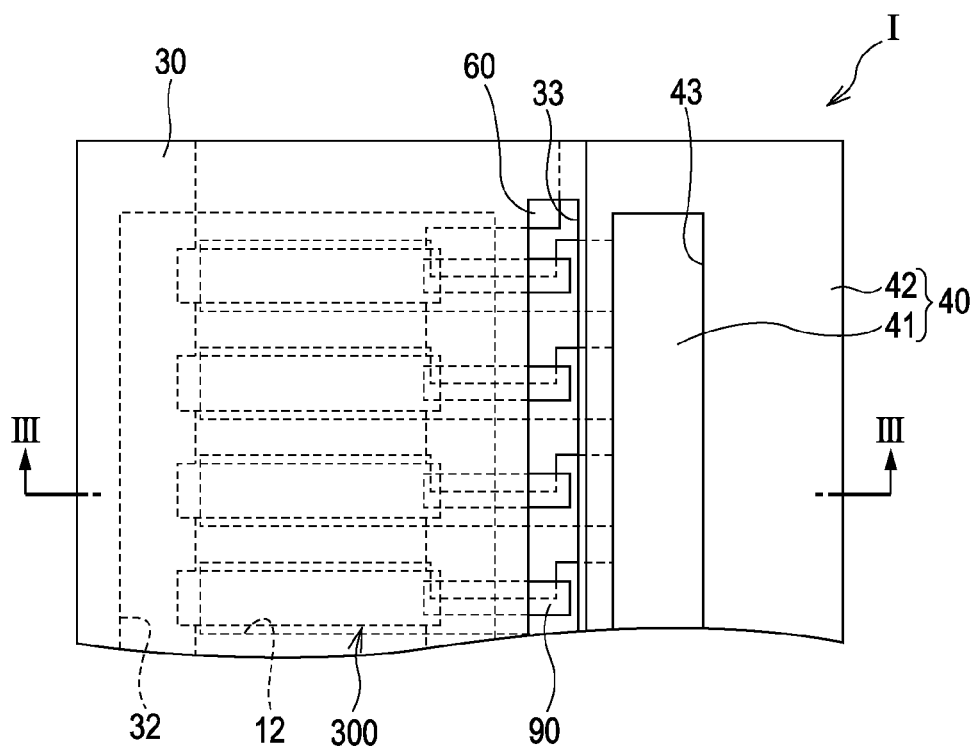
FIG. 2 is a plan view of the recording head according to the embodiment.
Figure 3:
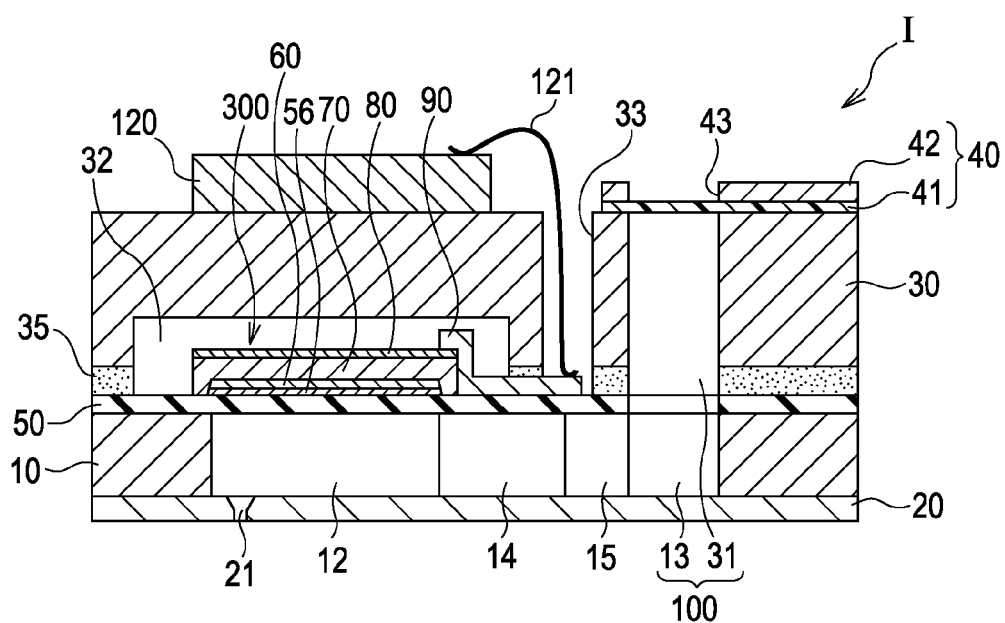
FIG. 3 is a sectional view of the recording head according to the embodiment.

FIG. 1 is a schematic exploded perspective view of an ink jet recording head I, which is a type of liquid ejecting head, according to an embodiment of the invention. FIG. 2 is a plan view of the ink jet recording head I shown in FIG. 1. FIG. 3 is a sectional view taken along line III-III shown in FIG. 2. A flow channel substrate 10 is made of monocrystalline silicon, and a silicon dioxide elastic film 50 is disposed on one surface of the flow channel substrate 10, as shown in FIGS. 1 to 3.

The flow channel substrate 10 has a plurality of pressure generating chambers 12 arranged in parallel in the direction of their widths. The flow channel substrate 10 also has a communicating section 13 therein located outside the pressure generating chambers 12 in their longitudinal direction. The communicating section 13 communicates with the pressure generating chambers 12 through corresponding ink supply channels 14 and communication paths 15. The communicating section 13 communicates with a manifold section 31 formed in a protective substrate (described later) to define a part of a manifold acting as a common ink chamber of the pressure generating chambers 12. Each ink supply channel 14 has a smaller width than the pressure generating chamber 12, so that the flow channel resistance of the ink delivered to the pressure generating chamber 12 from the communicating section 13 is kept constant. Although the ink supply channels 14 are formed by narrowing the flow channels from one side in the present embodiment, the flow channels may be narrowed from both sides in another embodiment. Alternatively, the ink supply channels 14 may be formed by reducing the depth of the flow channels, instead of narrowing the flow channels. In the present embodiment, the flow channel substrate 10 has liquid flow channels including the pressure generating chambers 12, the communicating section 13, the ink supply channels 14 and the communication paths 15.

The flow channel substrate 10 is joined to a nozzle plate 20 at the open side thereof with an adhesive, a thermal fusion film or the like. The nozzle plate 20 has nozzle apertures 21 communicating with the end portions of the corresponding pressure generating chambers 12 on the opposite side to the ink supply channels 14. The nozzle plate 20 can be made of, for example, glass-ceramic, monocrystalline silicon or stainless steel.

On the opposite side to the open side of the flow channel substrate 10, the above-mentioned elastic film 50 is disposed, and an adhesion layer 56 having a thickness of, for example, about 30 to 50 nm and made of titanium oxide or the like is disposed on the elastic film 50 to enhance the adhesion between the elastic film 50 and the overlying first electrode 60. The elastic film 50 may be provided thereon with an insulating film made of zirconium oxide or the like, if necessary.

Furthermore, piezoelectric elements 300 are disposed on the adhesion layer 56. Each piezoelectric element 300 has a multilayer structure including a first electrode 60, a piezoelectric layer 70 having a small thickness of 2 μm or less, preferably 0.3 to 1.5 μm, and a second electrode 80. The piezoelectric element 300 mentioned herein refers to the portion including the first electrode 60, the piezoelectric layer 70 and the second electrode 80. In general, either electrode of the piezoelectric element 300 acts as a common electrode, and the other electrode and the piezoelectric layer 70 are formed for each pressure generating chamber 12 by patterning. Although in the present embodiment, the first electrode 60 acts as the common electrode of the piezoelectric elements 300 and the second electrode 80 is provided as discrete electrodes of the piezoelectric elements 300, the functions of the first and second electrodes may be reversed for the sake of convenience of the driving circuit and wiring. An actuator device mentioned herein is defined by a combination of the piezoelectric element 300 and a vibration plate that can be displaced by the operation of the piezoelectric element 300. Although in the embodiment above, the elastic film 50, the adhesion layer 56, the first electrode 60 and, optionally, an insulating film act as a vibration plate, the structure of the vibration plate is not limited to the above, and the elastic film 50 and the adhesion layer 56 may not be provided. The piezoelectric element 300 may double as a vibration plate in substance.

In the following description, the perovskite structure of a complex oxide containing transition metals will be expressed by ABO$_3$. In the expression, A represents the A site and has 12 oxygen ligands, and B represents the B site and has 6 oxygen ligands.

In the present embodiment, the piezoelectric layer 70 is made of a complex oxide that has a perovskite structure containing bismuth (Bi) and iron (Fe), and contains at least one of magnesium (Mg) and zinc (Zn) as a first dopant element and cerium (Ce) as a second dopant element. Thus, leakage current can be suppressed, and consequently, the piezoelectric element can exhibit a high insulation value, as will be described later. In addition, since the complex oxide does not contain lead, the environmental load of the piezoelectric element can be reduced.

In the perovskite structure of the complex oxide, the A site contains Bi and the B site contains Fe. The Bi in the A site and the Fe in the B site may each be partially substituted with other elements. Exemplary substitution elements for the A site include lanthanum (La), praseodymium (Pr), neodymium (Nd), samarium (Sm), and yttrium (Y), and exemplary substitution elements for the B site include cobalt (Co), chromium (Cr), manganese (Mn), nickel (Ni), and copper (Cu).

The Bi of $BiFeO_3$ or the like is easily evaporated in manufacturing processes, particularly during firing of the piezoelectric layer. Consequently, a crystal defect is liable to occur in the A site. The Bi removed from the A site will diffuse into the atmosphere of the manufacturing chamber and to the lower electrode side. As Bi escapes from the system, oxygen is lost to maintain the balance of the number of electrons. The ratio of bismuth defects to oxygen defects is 2:3 from the viewpoint of the charge neutrality principle. Oxygen defects reduce the orbital energy of the d electrons of the transition metals through Coulomb potential and narrow the band gap of the piezoelectric element. Thus, the presence of oxygen defects can be a direct cause of leakage current. In order to reduce the number of oxygen defects, Bi defects can be reduced. For this purpose, Bi may be added excessively to a stoichiometric composition in advance. However, an excessive amount of Bi will enter not only the A site, but also the B site unintentionally in a certain proportion. The Bi having entered the B site acts as a supply source of electron carriers, and leakage current thus occurs in the piezoelectric element. It is therefore not suitable to add Bi excessively to a stoichiometric composition in a $BiFeO_3$ system.

As with Bi, lead (Pb) in conventionally used lead zirconate titanate ($PbZrTiO_3$, PZT) easily evaporates in manufacturing processes. Accordingly, in general, Pb is added excessively to the stoichiometric composition in advance. When Pb is excessive, Pb will unintentionally enter the B site. However, the electronic structure of PZT can maintain the band gap even if Pb has been unintentionally introduced to the B site, as will be described with reference to FIG. 7. Therefore, for producing a piezoelectric material $PbZrTiO_3$, the insulation value of the $PbZrTiO_3$ is not reduced even if Pb is excessively added to the stoichiometric composition.

The present inventors have learned the following through examinations using a first-principles electronic state calculation.

FIGS. 4 to 8 show electronic densities of states obtained by first-principles electronic state calculation. In these figures, the horizontal axis represents the electronic energy difference (eV), and the vertical axis represents the electronic density of states (DOS). The positive values of the DOS correspond to spin up components, and the negative values of the DOS correspond to spin down components. For the first-principles electronic states calculation, an ultra soft pseudopotential is used on the basis of the density functional method within generalized gradient approximation (GGA). In order to take account of the strong correlation effect resulting from the locality of the d electron orbitals, the GGA plus U method was used for the transition metal atoms of the B site. Cutoff values of wave functions and charge density are 20 hartrees and 360 hartrees, respectively. The super cell of the crystal used for calculation was formed with 8 (2×2×2) $ABO_3$-form perovskite structures. The k-point mesh (mesh of reciprocal lattice points) is 4×4×4.

Figure 4:
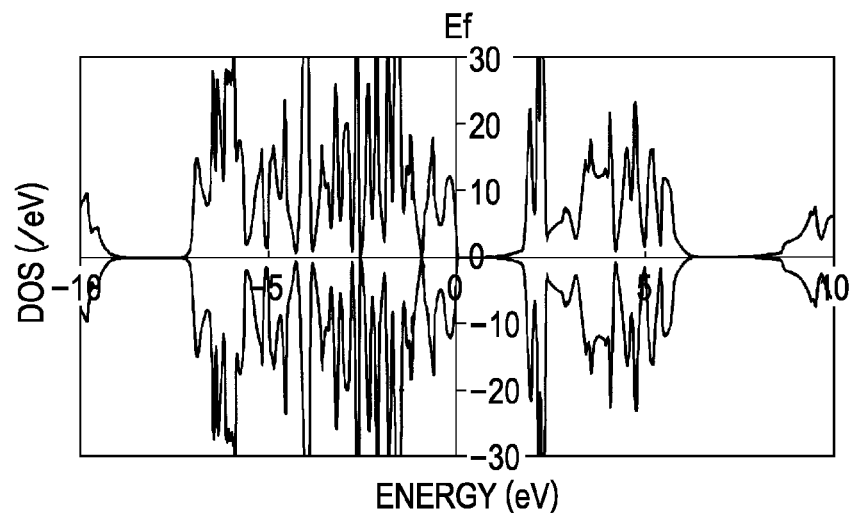
FIG. 4 is a representation of the electronic density of states of $BiFeO_3$ perfect crystal.
Figure 5:
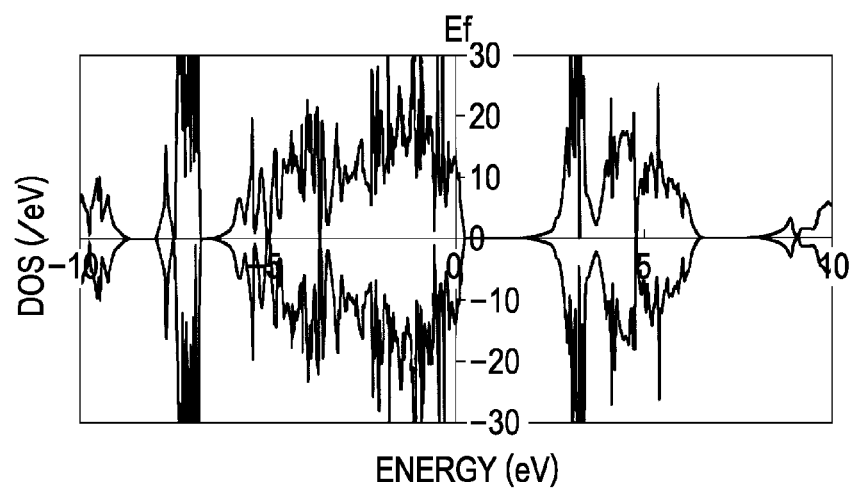
FIG. 5 is a representation of the electronic density of states of $BiFeO_3$ in which Bi is 12.5% defective in the A site.
Figure 6:
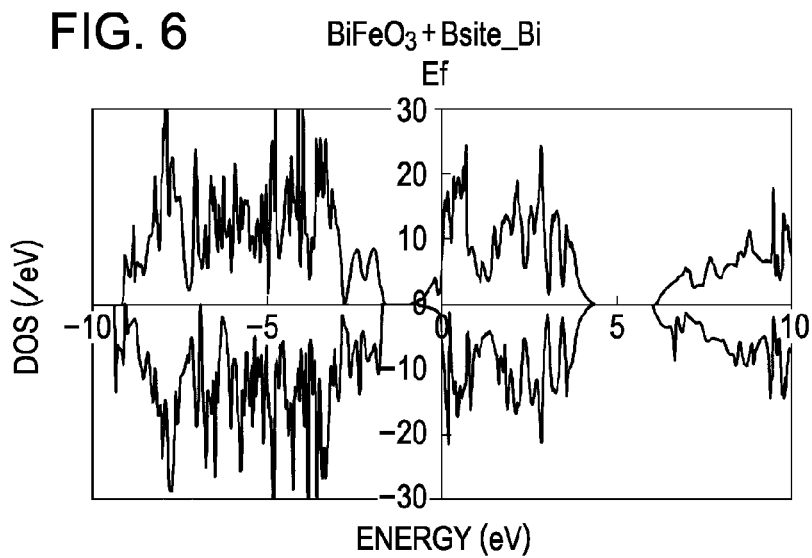
FIG. 6 is a representation of the electronic density of states of BiFeO$_3$ in which Bi is substituted for 12.5% of Fe in the B site.
Figure 7:
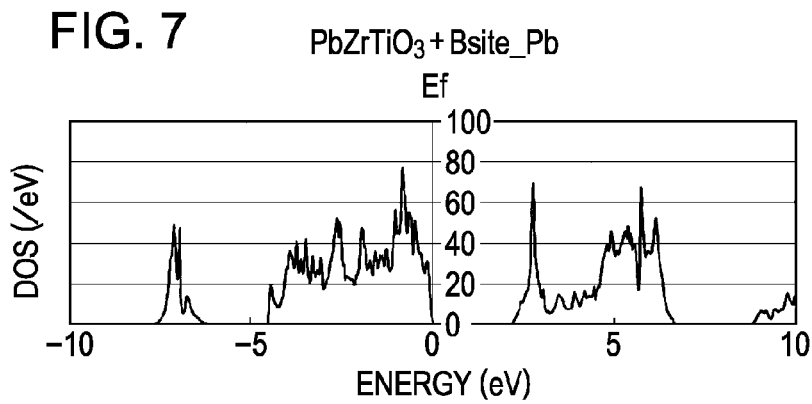
FIG. 7 is a representation of the electronic density of states of PbZrTiO$_3$ in which Pb is substituted for 12.5% of transition metals in the B site.
Figure 8:
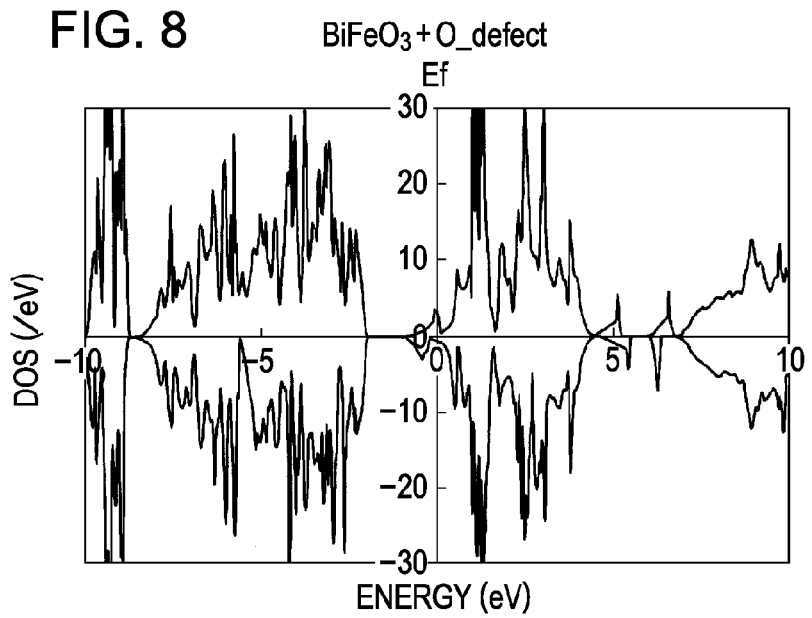
FIG. 8 is a representation of the electronic density of states of BiFeO$_3$ in which 4% of oxygen in the oxygen site has been lost.

FIG. 4 shows the electronic density of states of a perfect crystal of bismuth ferrate ($BiFeO_3$). FIG. 5 shows the electronic density of states of $BiFeO_3$ in which Bi in the A site is 12.5% defective. FIG. 6 shows the electronic density of states of $BiFeO_3$ whose B site contains 12.5% of Bi. FIG. 7 shows the electronic density of states of lead zirconate titanate ($PbZrTiO_3$) whose B site contains 12.5% of Pb. FIG. 8 shows the electronic density of states of bismuth ferrate ($BiFeO_3$) in which 4% of oxygen in the oxygen site has been lost.

In all cases shown in FIGS. 4, 5, 6 and 8, the complex oxide was stable in the antiferromagnetic state.

As shown in FIG. 4, in $BiFeO_3$ perfect crystal, that is, in the case where each site has no vacancies and where Bi has not been substituted with any other element, the highest electron-occupied level (Ef) lies at the top of the valance band and the band gap is widened. The material is thus insulating. In FIG. 4, the valence band is on the low energy side of the band gap, and the conduction band is on the high energy side of the band gap.

The highest electron-occupied level refers to the highest energy level of orbitals that electrons occupy in electronic energy obtained by an electron state simulation. In each graph, the highest electron-occupied level (Ef) lies at the zero point on the horizontal axis.

As shown in FIG. 5, when part of the Bi in the A site of $BiFeO_3$ is lost, thereby producing a defect, a density of empty states appears on the positive side of the position of an energy of 0 eV. In other words, the highest electron-occupied level enters the energy region of valence band. This shows that the system becomes non-insulating and produces hole carriers, thus changing the electric conduction into p-type conduction. By measuring the empty area of the density of states, it can be shown that Bi vacancies in the A site provide three hole carriers.

When the B site contains bismuth (Bi), the density of states expands to the negative side of the position at an energy of 0 eV, as shown in FIG. 6. In other words, the highest electron-occupied level enters the energy region of conduction band. This shows that the system becomes non-insulating and produces electron carriers, thus exhibiting n-type conductivity. By measuring the area with the density of occupied states, it can be shown that the Bi of the B site provides two electron carriers. It is therefore undesirable that an excessive amount of Bi is used in a composition prepared in the manufacturing process from the viewpoint of suppressing leaking. Such an amount of Bi results in introduction of electron carriers to the system.

FIG. 7 shows the density of electron states of PZT whose B site contains 12.5% of Pb. PZT piezoelectric materials can maintain the band gap in the electronic structure, as shown in FIG. 7, even if the B site contains unintended Pb. Accordingly, for producing a $PbZrTiO_3$ piezoelectric material, the insulation value of the piezoelectric material is not reduced even if Pb has been excessively added to the stoichiometric composition.

When the oxygen site of $BiFeO_3$ has vacancies of 4%, the density of states expands to the negative side of the position at an energy of 0 eV, as shown in FIG. 8. In other words, the highest electron-occupied level enters the energy region of conduction band. This shows that the system becomes non-insulating and produces electron carriers, thus exhibiting n-type conductivity. By measuring the area of the density of occupied states, it can be shown that the loss in the oxygen site provides two electron carriers.

Thus, $BiFeO_3$ has both an n-type defect and a p-type defect, as shown in FIGS. 5, 6 and 8. In a semiconductor material, for example, the electronic states of carriers in the conduction band and the valence band are of free electrons. Accordingly, hole carriers deriving from the p-type defect and electron carriers deriving from the n-type defect spread spatially, thus negating each other. On the other hand, in a transition metal oxide, carriers in the conduction band and the valence band are localized and their mobilities are small. Consequently, hole carriers and electron carriers do not completely cancel each other out. Thus, in the transition metal oxide, carriers that are not canceled out contribute to electric conduction of the system as hopping conduction.

Figure 9:
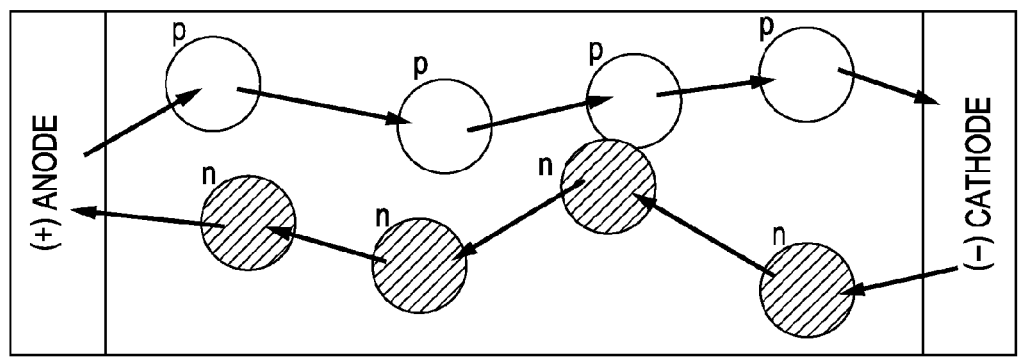
FIG. 9 is a schematic representation of the hopping conduction in a complex oxide crystal.

FIG. 9 schematically shows the state of the hopping conduction of a transition metal compound having p-type defects and n-type defects. In the transition metal compound, channels for hopping conduction are formed through which hole carriers and electron carriers transfer via the p-type defects and the n-type defects, respectively. In this state, even if the transition metal compound is doped so as to compensate for carriers of one side, hopping conduction caused by the other side cannot be suppressed. This is probably the reason why the insulation value of $BiFeO_3$ cannot be increased.

Accordingly, leakage current cannot be prevented even if an n-type dopant element that can cancel out the p-type defect or a p-type dopant element that can cancel out the n-type defect is independently introduced. However, by simultaneously introducing an n-type dopant element and a p-type dopant element (co-doping), leakage current caused by the p-type defect and leakage current caused by the n-type defect can be prevented.

The invention is based on the above-described findings, in which a transition metal complex oxide, such as $BiFeO_3$, is simultaneously doped (co-doped) with an n-type dopant element and a p-type dopant element so as to prevent leakage current caused by the p-type defect and leakage current caused by the n-type defect and thus to enhance the insulation value of the complex oxide.

Figure 10:
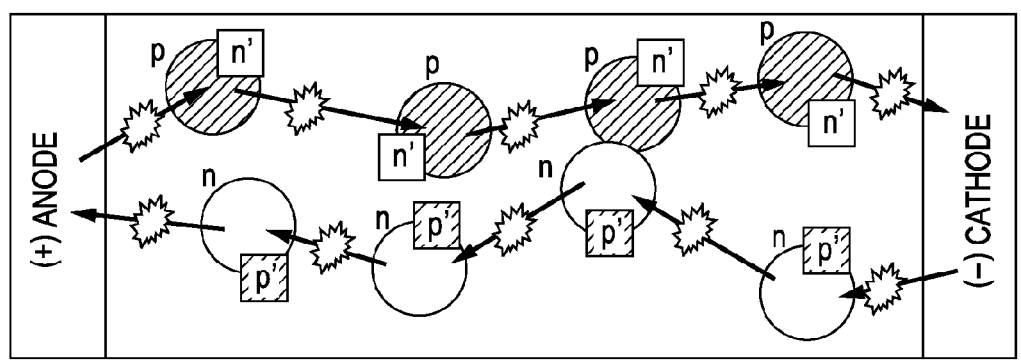
FIG. 10 is a schematic representation of the hopping conduction in the crystal of a complex oxide used in an embodiment of the invention.

FIG. 10 schematically shows a transition metal compound used in an embodiment of the invention that has been co-doped with an n-type dopant element and a p-type dopant element. By co-doping a transition metal complex oxide, such as $BiFeO_3$, with an n-type dopant element and p-type dopant element, the p-type defect is canceled out by the n-type dopant element, and the n-type defect is canceled out by the p-type dopant element. Thus, leakage current generated by hopping among the p-type defects and leakage current generated by hopping among the n-type defects can be significantly reduced.

More specifically, in the present embodiment, for example, $BiFeO_3$ is doped with a first dopant element that is at least one of magnesium (Mg) and zinc (Zn) and with a second dopant element that is cerium (Ce).

The first dopant element is substituted for an element of the B site, and the second dopant element is substituted for an element of the A site. The first dopant element acts as a p-type donor and cancels out n-type defects, and the second dopant element acts as an n-type donor and cancels out p-type defects.

Figure 11:
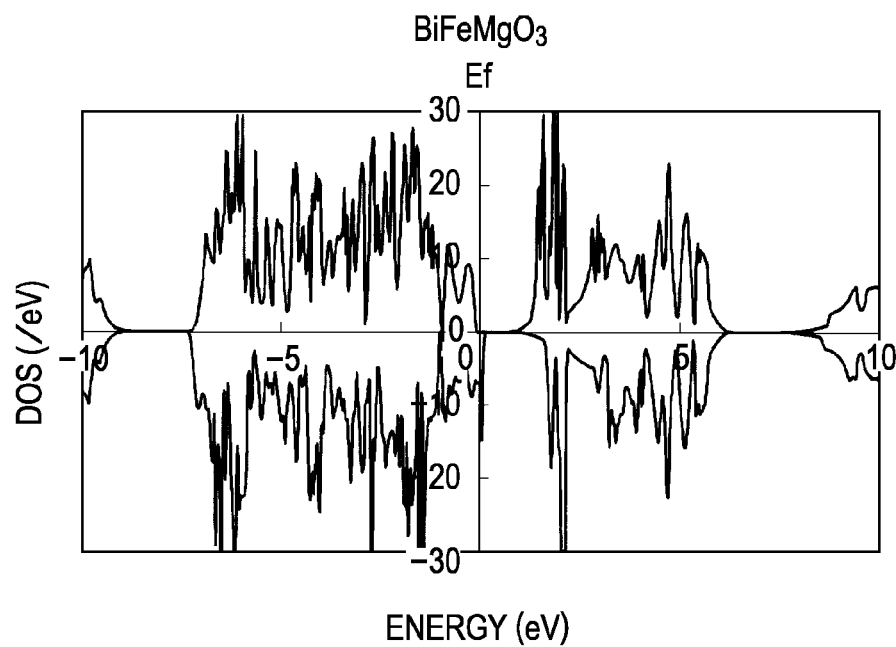
FIG. 11 is a representation of the electronic density of states of BiFeO$_3$ in which 12.5% of Fe in the B site is substituted with Mg.
Figure 12:
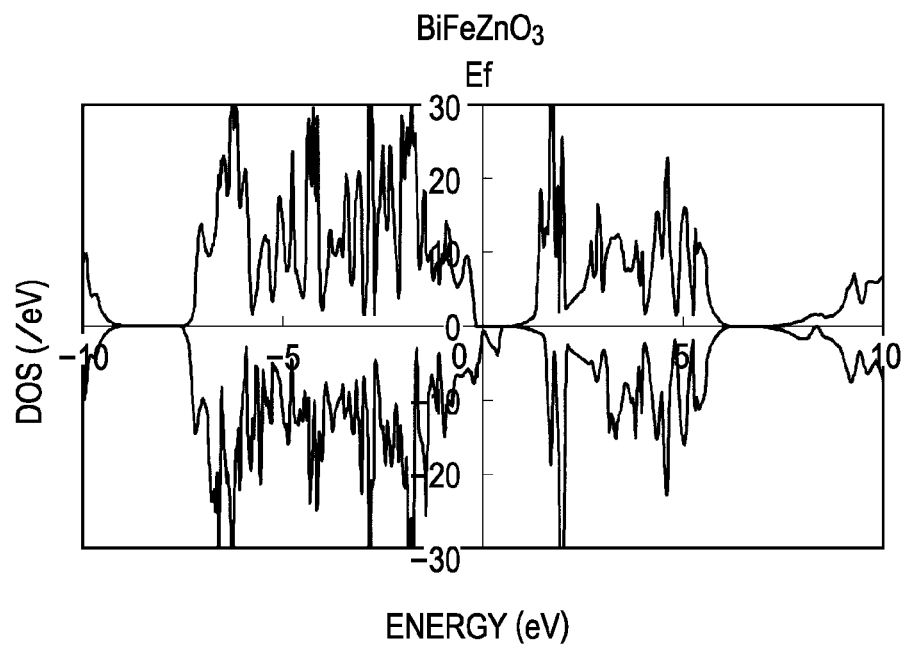
FIG. 12 is a representation of the electronic density of states of BiFeO$_3$ in which 12.5% of Bi in the A site is substituted with Zn.
Figure 13:
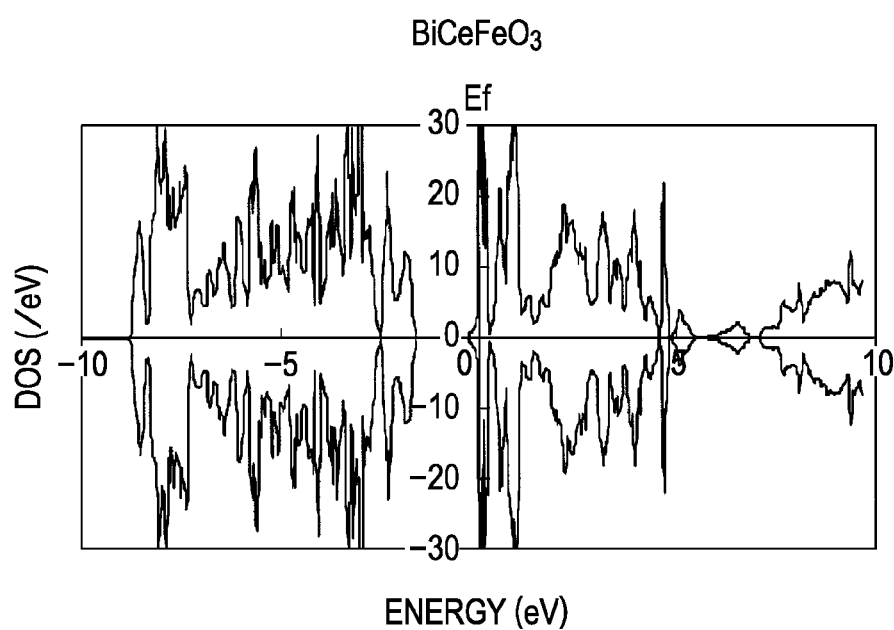
FIG. 13 is a representation of the electronic density of states of BiFeO$_3$ in which 12.5% of Bi in the A site is substituted with Ce.

FIGS. 11 to 13 show electronic densities of states obtained by the first-principles electronic state calculation: FIG. 11 shows the electronic density of states of a $BiFeO_3$-based crystal in which 12.5% of Fe of the B site has been substituted with magnesium (Mg); FIG. 12 shows the electric density of states of a $BiFeO_3$-based crystal in which 12.5% of Fe of the B site has been substituted with zinc (Zn); and FIG. 13 shows the electronic density of states of a $BiFeO_3$-based crystal in which 12.5% of Bi of the A site has been substituted with cerium (Ce). The first-principles electronic state calculation was performed under the same conditions as mentioned above.

As shown in FIGS. 11 and 12, a density of empty states appears on the positive side of the position of an energy of 0 eV by forcibly substituting part of the Fe of $BiFeO_3$ with a first dopant element, magnesium (Mg) or zinc (Zn). In other words, the highest electron-occupied level enters the energy region of valence band. This shows that the system becomes non-insulating and produces hole carriers, thus changing the doping type into the p type. By measuring the empty area of the density of states, it can be shown that the first dopant element for the B site provides hole carriers. More specifically, when the first dopant element is Mg or Zn, one hole carrier is provided. Thus, Mg and Zn each act as a p-type donor.

On the other hand, when part of the Bi of $BiFeO_3$ is forcibly substituted with the second dopant element Ce, a density of occupied states appears on the negative side of the position of an energy of 0 eV, as shown in FIG. 13. In other words, the highest electron-occupied level enters the energy region of the conduction band. This shows that the system becomes non-insulating and produces electron carriers, thus exhibiting n-type conductivity. By measuring the area of the density of occupied states, it can be shown that the Ce having been substituted at the A site provides one electron carrier. This shows that cerium acts as an n-type donor.

As described above, in the present embodiment, $BiFeO_3$ is doped with at least one first dopant element selected from Mg and Zn to cancel out n-type defects, and it is also doped with Ce as a second dopant element to cancel out p-type defects. Consequently, a high insulation value can be maintained. Since the first dopant elements Mg and Zn each give one hole carrier to a system, they can each cancel out one electron carrier produced from an n-type defect. Also, since the second dopant element Ce gives one electron carrier to a system, it can cancel out one hole carrier produced from a p-type defect.

The second dopant element that will be located in the A site will not completely cancel out Bi defects. Hence, the atomic defect in the A site can be present together with the second dopant element of the A site. For example, even if Bi defects are present in the A site, the dopant element does not always enter the positions from which Bi atoms have been lost, and the dopant element may be introduced by being substituted for other bismuth atoms or other element in the A site. Then, the dopant element acts so as to cancel out the p-type Bi defects in the A site.

Preferably, the first dopant element, which is at least one of Mg and Zn, is introduced in an amount equivalent to the amount of expected n-type defects, and the second dopant element Ce is introduced in an amount equivalent to the amount of expected p-type defects. For example, the proper amount of first dopant element is 10% or less, and preferably 5% or less. Either of the first dopant elements may be introduced, or both the first dopant elements may be introduced at one time.

These dopant elements, which differ from the elements constituting the perovskite structure of the original material, are introduced according to the amount of defects in the crystal.

In the present embodiment, the A site of the complex oxide may contain lanthanum having a large ionic radius. The presence of lanthanum can suppress the formation of other phases different from the perovskite structure. The ability of lanthanum to form a covalent bond with the closest oxygen is much lower than that of bismuth. Accordingly, the potential barrier of lanthanum lowers against the rotation of polarization moments by an applied electric field. Conditions under which the rotation of polarization moments is likely to occur easily enhance the piezoelectric properties. Also, since lanthanum is a metal having an ionic valence of +3, the valence balance of the system in the present embodiment does not change and does not have an adverse effect on the conditions of leakage current even if lanthanum is present in the A site. Preferably, the proportion on a mole basis of lanthanum in the A site is in the range of 0.05 to 0.20 relative to the total of bismuth and lanthanum. Praseodymium, neodymium and samarium are each an element having a large radius and having an ionic valence of +3, and therefore have the same effect as lanthanum.

The complex oxide may contain Co or Cr or both in the B site, in addition to Fe. These elements are preferably contained in the range of 0.125 to 0.875 on a mole basis relative to the total of all elements in the B site. Thus, when the complex oxide contains Fe, Co and Cr in predetermined proportions, the insulation value and magnetism of the complex oxide can be maintained. In addition, such a complex oxide has a morphotropic phase boundary (MPB), and therefor exhibits high piezoelectric properties. In particular, when the molar ratio of Co or Cr to the total of Fe and Co or Cr is about 0.5, the piezoelectric constant is increased due to the MPB, and, thus, the piezoelectric properties can be enhanced.

Furthermore, the complex oxide preferably contains barium titanate having a stoichiometric composition (for example, $BaTiO_3$ having a perovskite structure), in addition to $BiFeO_3$. In this instance, a MPB appears between $BiFeO_3$ having a rhombohedral structure and $BaTiO_3$ having a tetragonal structure at room temperature. The composition ratio in which a MPB appears is $BiFeO_3:BaTiO_3=3:1$. In this composition, the piezoelectric layer 70 can exhibit high piezoelectric properties, and, consequently, can displace the vibration plate significantly at a low voltage. If the piezoelectric layer 70 contains barium titanate, the piezoelectric material is a complex oxide (for example, $(Bi,Ba)(Fe,Ti)O_3$) having a perovskite structure containing barium titanate and a main constituent, for example, bismuth ferrate, and simultaneously doped with the first dopant element and the second dopant element.

In the present embodiment, the piezoelectric layer 70 has a monoclinic crystal structure. Hence, the piezoelectric layer 70 made of a complex oxide having a perovskite structure has monoclinic symmetry. Such a piezoelectric layer 70 can exhibit high piezoelectric properties. This is probably because the polarization moments of the piezoelectric layer 70 take a structure easy to rotate under an electric field applied in the direction perpendicular to the surface. In the piezoelectric layer 70, the variation in polarization moment and the deformation of the crystal structure are directly combined, and this determines the piezoelectric properties. Thus, structures in which polarization moments are easy to change can exhibit high piezoelectric properties.

Furthermore, the piezoelectric layer 70 preferably has an engineered domain structure in which the polarization leans at a predetermined angle (50 to 60 degrees) with the direction perpendicular to the surface of the layer.

The crystalline orientation of the piezoelectric layer 70 may be in the (100), (111) or (110) plane or in mixed directions, as long as satisfying the requirements of polarization direction in the above engineered domain.

The second electrode 80 provided for each piezoelectric element 300 is connected with a lead electrode 90 made of, for example, gold (Au) extending from one end to the ink supply channel 14 side of the second electrode 80 to the upper surface of the elastic film 50 and, optionally, the upper surface of an insulating film.

A protective substrate 30 having a manifold section 31 defining at least part of a manifold 100 is joined to the flow channel substrate 10 having the piezoelectric elements 300 with an adhesive 35 so as to cover the first electrode 60, and the elastic film 50, an optionally provided insulating film, and the lead electrodes 90. The manifold section 31 passes through the thickness of the protective substrate 30 and extends along the widths of the pressure generating chambers 12. Thus, the manifold section 31 communicates with the communicating section 13 of the flow channel substrate 10 to form the manifold 100 acting as the common ink chamber of the pressure generating chambers 12. The communicating section 13 of the flow channel substrate 10 may be divided for each pressure generating chamber 12, and only the manifold section 31 may serve as the manifold. Alternatively, the flow channel substrate 10 may have only the pressure generating chambers 12, and the manifold 100 and ink supply channels 14 communicating with the respective pressure generating chambers 12 are formed in a member between the flow channel substrate 10 and the protective substrate 30, such as the elastic film 50 and an optionally provided insulating film.

A piezoelectric element-protecting section 32 is formed in the region of the protective substrate 30 corresponding to the piezoelectric elements 300. The Piezoelectric element-protecting section 32 has a space so that the piezoelectric elements 300 can operate without interference. The space of the piezoelectric element-protecting section 32 is intended to ensure the operation of the piezoelectric elements 300, and may or may not be sealed.

Preferably, the protective substrate 30 is made of a material having substantially the same thermal expansion coefficient as the flow channel substrate 10, such as glass or ceramic. In the present embodiment, the protective substrate 30 is made of the same monocrystalline silicon as the flow channel substrate 10.

The protective substrate 30 has a through hole 33 passing through the thickness of the protective substrate 30. The ends of the lead electrodes 90 extending from the piezoelectric elements 300 are exposed in the through hole 33.

A driving circuit 120 is secured on the protective substrate 30 and drives the piezoelectric elements 300 arranged in parallel. The driving circuit 120 may be a circuit board, a semiconductor integrated circuit (IC) or the like. The driving circuit 120 is electrically connected to each lead electrode 90 with a conductive connection wire 121, such as bonding wire.

Furthermore, a compliance substrate 40 including a sealing film 41 and a fixing plate 42 is joined on the protective substrate 30. The sealing film 41 is made of a flexible material having a low rigidity, and seals one end of the manifold section 31. The fixing plate 42 is made of a relatively hard material. The portion of the fixing plate 42 opposing the manifold 100 is completely removed to form an opening 43; hence the manifold 100 is closed at one end only with the flexible sealing film 41.

The ink jet recording head I of the present embodiment draws an ink through an ink inlet connected to an external ink supply unit (not shown). The ink is delivered to fill the spaces from the manifold 100 to the nozzle apertures 21. Then, the ink jet recording head I applies a voltage between the first electrode 60 and each second electrode 80 corresponding to the pressure generating chambers 12, according to the recording signal from the driving circuit 120. Thus, the elastic film 50, the adhesion layer 56, the first electrode 60 and the piezoelectric layers 70 are deformed to increase the internal pressure in the pressure generating chambers 12, thereby ejecting the ink through the nozzle apertures 21.

A method for manufacturing the ink jet recording head according to an embodiment of the invention will be described with reference to FIGS. 14A to 18B. FIGS. 14A to 18B are sectional views of the pressure generating chamber taken in the longitudinal direction.

Figure 14A:
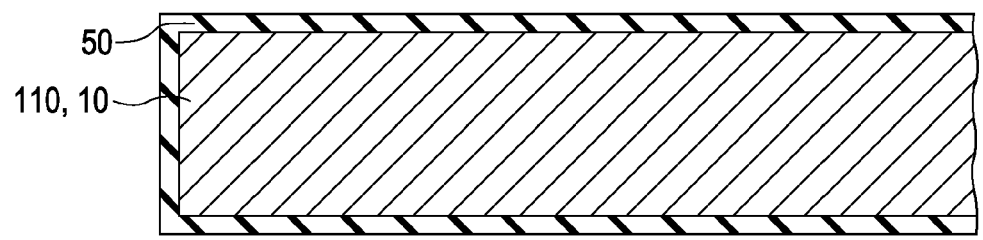
FIGS. 14A and 14B are sectional views showing a manufacturing process of a recording head according to an embodiment of the invention.
Figure 14B:
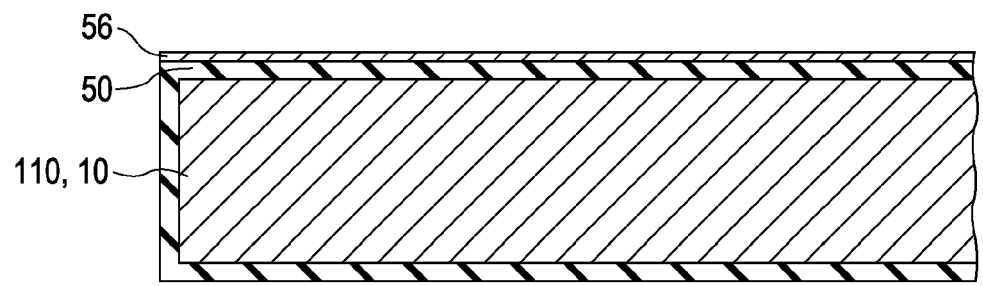

As shown in FIG. 14A, a silicon dioxide ($SiO_2$) film is formed for an elastic film 50 on the surface of a silicon wafer 110 for a flow channel substrate 10 by thermal oxidation or the like. Then, an adhesion layer 56 is formed of, for example, titanium oxide on the SiO₂ elastic film 50 by sputtering, thermal oxidation or the like, as shown in FIG. 14B.

Figure 15A:
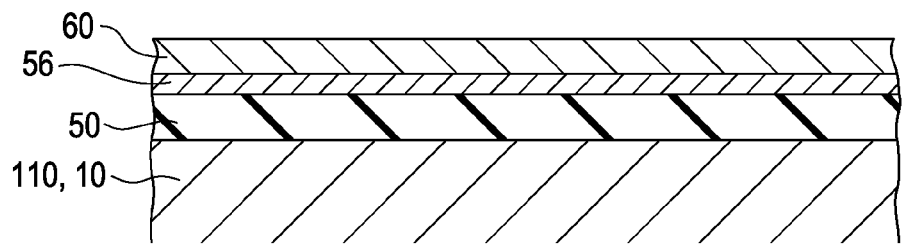
FIGS. 15A to 15C are sectional views showing the manufacturing process of the recording head.

Subsequently, as shown in FIG. 15A, a platinum film for a first electrode 60 is formed over the entire surface of the adhesion layer 56 by sputtering.

Then, a piezoelectric layer 70 is formed on the platinum film. The piezoelectric layer 70 may be formed by a chemical solution method such as a sol-gel method or metal-organic deposition (MOD), in which a coating of a solution containing a metal complex is dried and fired at a high temperature to form a metal oxide piezoelectric layer, or a gas phase method such as sputtering. Other methods may be applied for forming the piezoelectric layer 70, such as laser ablation, pulsed laser deposition (PLD), CVD or aerosol deposition.

Figure 15B:
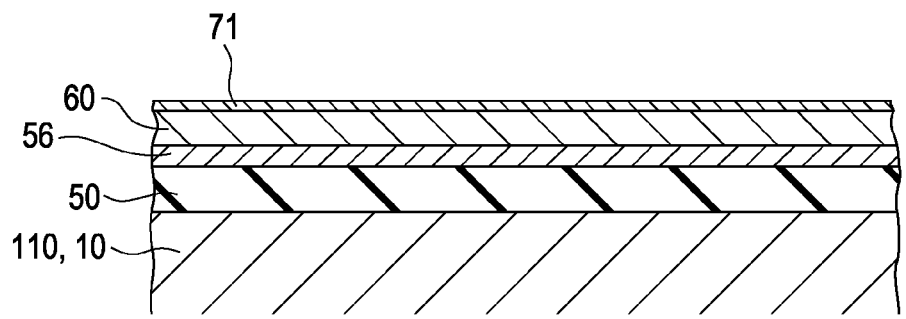

More specifically, the piezoelectric layer 70 is formed as follows. First, as shown in FIG. 15B, a sol or MOD solution (precursor solution) containing metal complexes containing Bi and Fe, optionally La, Co or Cr, and the first dopant element and the second dopant element in a desired proportion is applied onto the first electrode 60 by spin coating or the like, thus forming a piezoelectric precursor film 71 (coating).

The precursor solution is prepared by mixing metal complexes that can form a complex oxide containing Bi and Fe, optionally La, Co or Cr, and the first and second dopant elements so that each metal can have a desired proportion on a mole basis, and by dissolving or dispersing the mixture in an organic solvent, such as an alcohol.

In this process, the "metal complexes that can form a complex oxide containing Bi and Fe, optionally La, Co or Cr, and the first and second dopant elements" refer to metal complexes in a mixture, each containing at least one metal of Bi, Fe, optionally added La, Co or Cr, and the first and second dopant elements. Examples of such metal complexes include metal alkoxides, organic acid salts, β-diketone complexes.

The metal complex containing Bi may be bismuth 2-ethylhexanoate. The metal complex containing Fe may be iron 2-ethylhexanoate. The metal complex containing Co may be cobalt 2-ethylhexanoate. The metal complex containing Cr may be chromium 2-ethylhexanoate. The metal complex containing La may be lanthanum 2-ethylhexanoate. The metal complex containing Mg may be magnesium 2-ethylhexanoate. The metal complex containing Zn may be zinc 2-ethylhexanoate. The metal complex containing Ce may be cerium 2-ethylhexanoate. Metal complexes containing two or more elements of Bi, Fe, Co and La may be used.

Subsequently, the piezoelectric precursor film 71 is heated to a predetermined temperature (150 to 400° C.) to be dried for a certain time (drying). Then, the dried piezoelectric precursor film 71 is further heated to a predetermined temperature and allowed to stand for a certain time to be degreased (degreasing). The degreasing mentioned herein is performed to convert organic components in the piezoelectric precursor film 71 into, for example, $NO_2$, $CO_2$ or $H_2O$ and thus to remove the organic components. The drying and degreasing may be performed in any atmosphere without particular limitation, and may be performed in the air or an inert gas atmosphere.

Figure 15C:
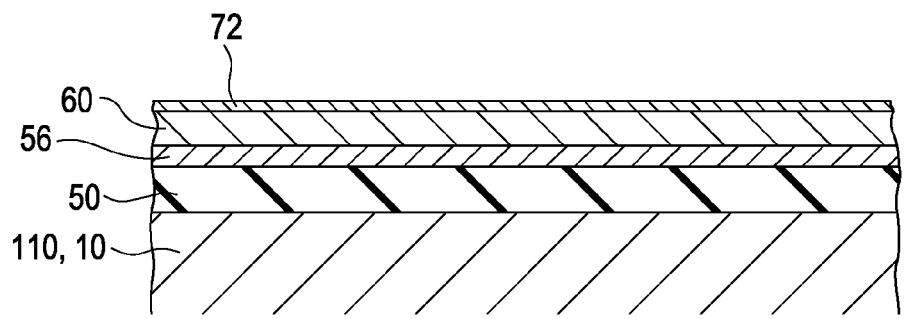

Then, as shown in FIG. 15C, the piezoelectric precursor film 71 is heated to a predetermined temperature, for example, to about 600 to 800° C., and allowed to stand for a certain time, thus being crystallized to form a piezoelectric film 72 (firing). This firing operation may be performed in any atmosphere without particular limitation, and may be performed in the air or an inert gas atmosphere.

The heating apparatus used for the drying, degreasing and firing operations may be a rapid thermal annealing (RTA) apparatus using an infrared lamp for heating, or a hot plate.

Figure 16A:
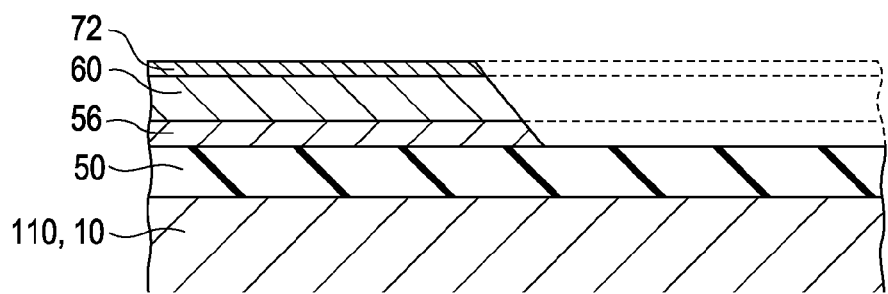
FIGS. 16A and 16B are sectional views showing the manufacturing process of the recording head.

Then, as shown in FIG. 16A, a resist layer having a predetermined shape (not shown) is formed on the piezoelectric film 72, and the piezoelectric film 72 and the first electrode 60 are simultaneously patterned using the resist layer as a mask so that their sides are inclined.

Figure 16B:
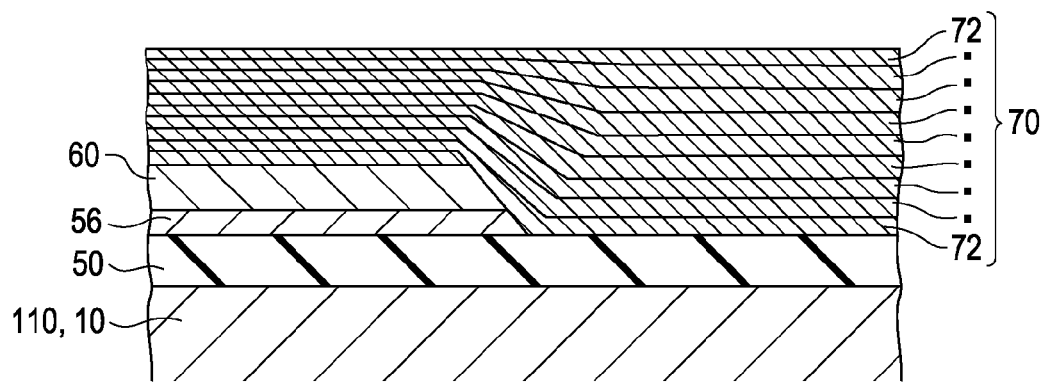

After removing the resist layer, the sequence of coating, drying and degreasing, or the sequence of coating, drying, degreasing and firing is repeated according to the desired thickness. Thus a piezoelectric layer 70 having a desired thickness including a plurality of piezoelectric films 72 is formed, as shown in FIG. 16B. If, for example, a coating formed by a single coating operation has a thickness of about 0.1 μm, the piezoelectric layer 70 including 10 piezoelectric films 72 has a total thickness of about 1.1 μm. Although a plurality of piezoelectric films 72 are layered in the present embodiment, the piezoelectric layer 70 may include only a single piezoelectric film 72 in another embodiment.

Figure 17A:
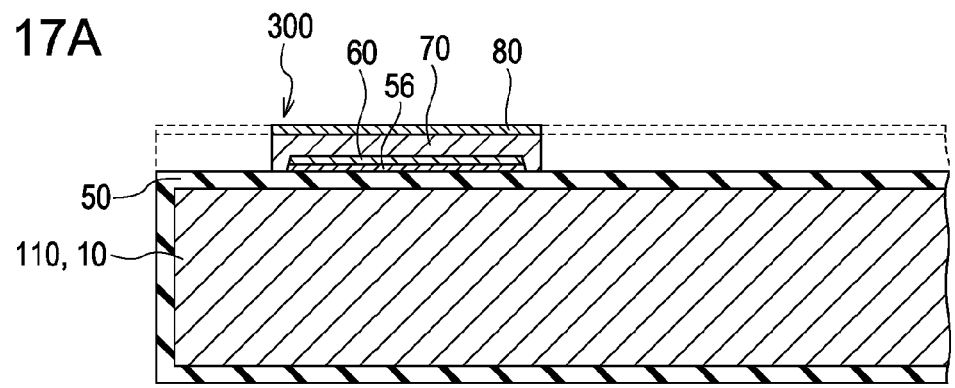
FIGS. 17A to 17C are sectional views showing the manufacturing process of the recording head.

After the piezoelectric layer 70 is formed, a second electrode 80 is formed of platinum on the piezoelectric layer 70 by sputtering or the like, as shown in FIG. 17A, and the piezoelectric layer 70 and the second electrode 80 are simultaneously patterned to form piezoelectric elements 300, each including the first electrode 60, the piezoelectric layer 70 and the second electrode 80, in the regions corresponding to the pressure generating chambers 12. The patterning of the piezoelectric layer 70 and the second electrode 80 can be performed at one time by dry etching through a resist layer (not shown) having a predetermined shape. After this operation, post-annealing may be performed at a temperature in the range of 600 to 800° C., if necessary. Thus, favorable interfaces can be formed between the piezoelectric layer 70 and the first electrode 60 and between the piezoelectric layer 70 and the second electrode 80, and, in addition, the crystallinity of the piezoelectric layer 70 can be enhanced.

Figure 17B:
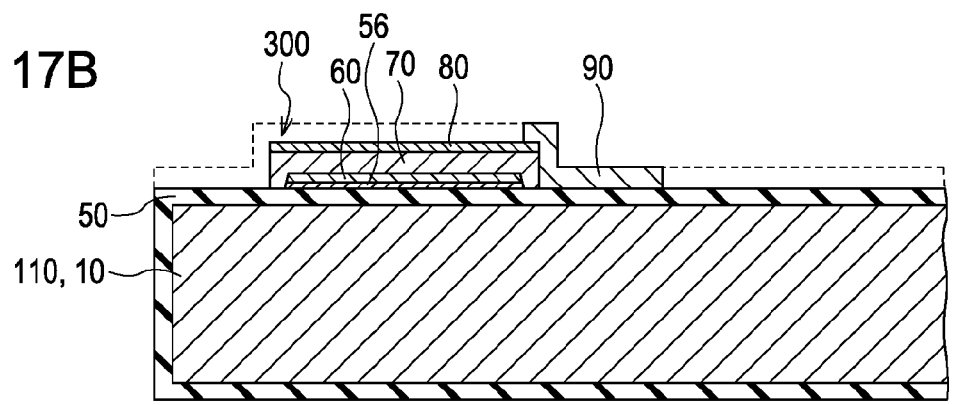

Then, as shown in FIG. 17B, a film is formed of, for example, gold (Au), over the entire surface of the flow channel substrate wafer 110, and is patterned into lead electrodes 90 for each piezoelectric element 300 through a mask pattern (not shown) made of, for example, resist.

Figure 17C:
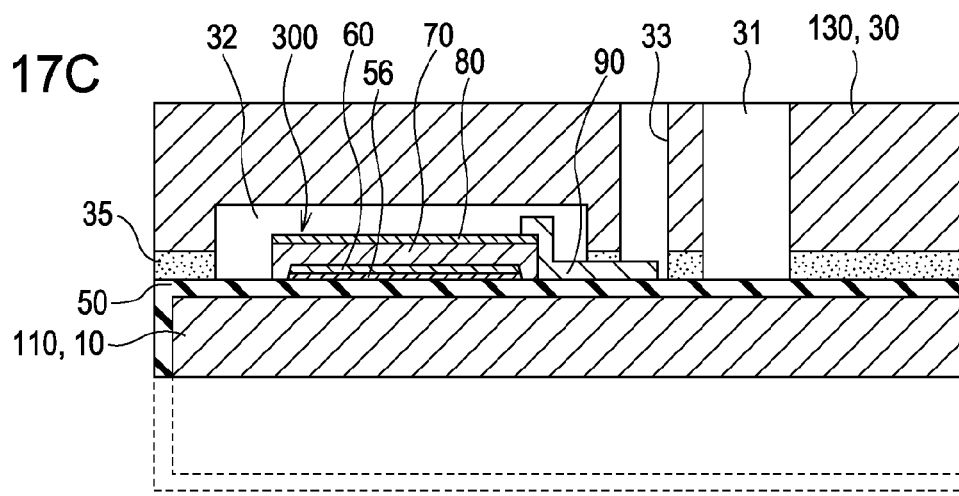

Then, as shown in FIG. 17C, after a silicon protective substrate wafer 130 for a plurality of protective substrates 30 is bonded to the piezoelectric element 300 side of the flow channel substrate wafer 110 with an adhesive 35, the thickness of the flow channel substrate wafer 110 is reduced.

Figure 18A:
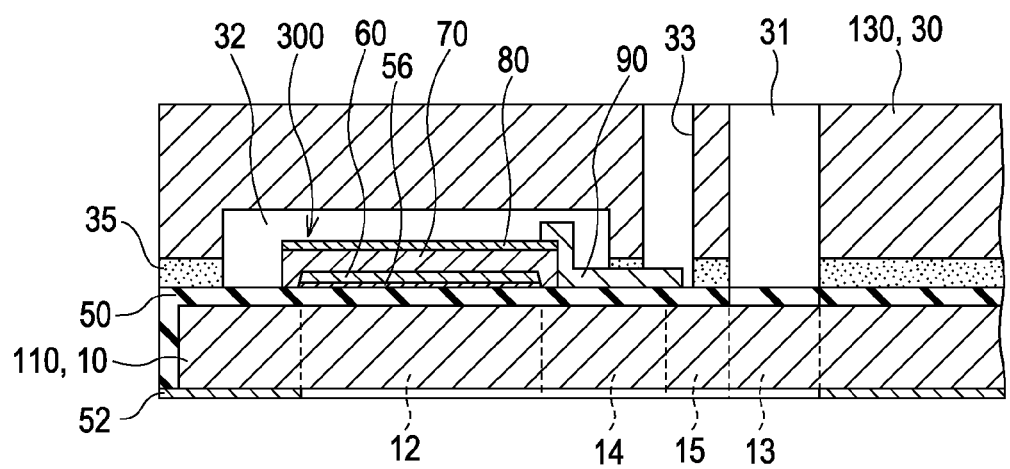
FIGS. 18A and 18B are sectional views showing the manufacturing process of the recording head.

Turning to FIG. 18A, a mask layer is formed on the surface of the flow channel substrate wafer 110 opposite to the protective substrate wafer 130 and is patterned into a mask 52 having a predetermined shape.

Figure 18B:
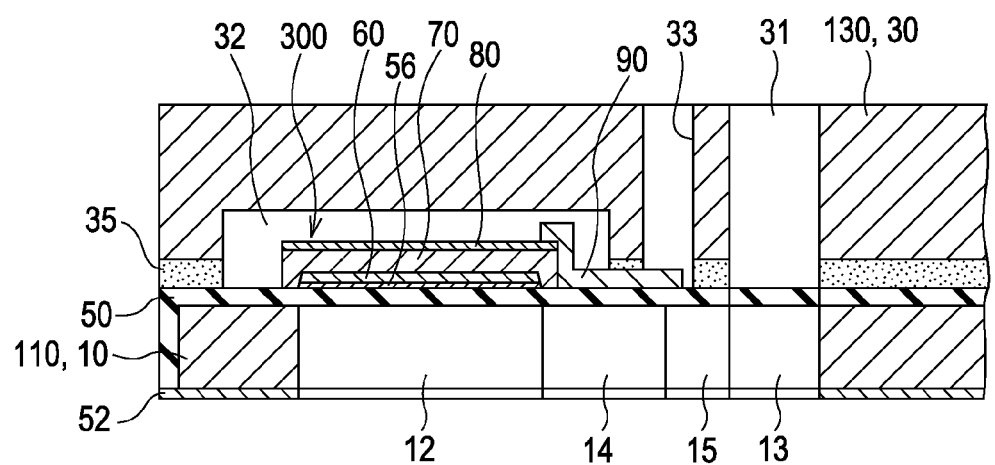

Subsequently, as shown in FIG. 18B, the flow channel substrate wafer 110 is subjected to anisotropic etching (wet etching) using an alkaline solution, such as KOH, through the mask 52 to form the pressure generating chambers 12 corresponding to the piezoelectric elements 300, the communicating section 13, the ink supply channels 14 and the communication paths 15 therein.

Then, unnecessary outer portions of the flow channel substrate wafer 110 and protective substrate wafer 130 are cut off by, for example, dicing. Subsequently, a nozzle plate 20 having nozzle apertures 21 therein is joined to the surface of the flow channel substrate wafer 110 opposite the protective substrate wafer 130 after the mask 52 has been removed, and a compliance substrate 40 is joined to the protective substrate wafer 130. The flow channel substrate wafer 110 joined to other substrates together is cut into chips, each including a flow channel substrate 10 and other members. Thus, the ink jet recording head I of the present embodiment is produced.

Although an exemplary embodiment of the invention has been described, the invention is not limited to the disclosed embodiment. For example, in the above embodiment, a monocrystalline silicon substrate is used as the flow channel substrate 10. However, the flow channel substrate 10 may be made of, for example, silicon-on-insulator (SOI) or glass, without particular limitation.

Also, although the piezoelectric element 300 of the above embodiment includes the first electrode 60, the piezoelectric layer 70 and the second electrode 80 that are stacked in that order on a substrate (flow channel substrate 10), the structure of the piezoelectric element is not limited to this structure. For example, an embodiment of the invention can be applied to a vertical vibration piezoelectric element including layers of a piezoelectric material and an electrode material alternately formed so as to expand and contract in the axis direction.

Figure 19:
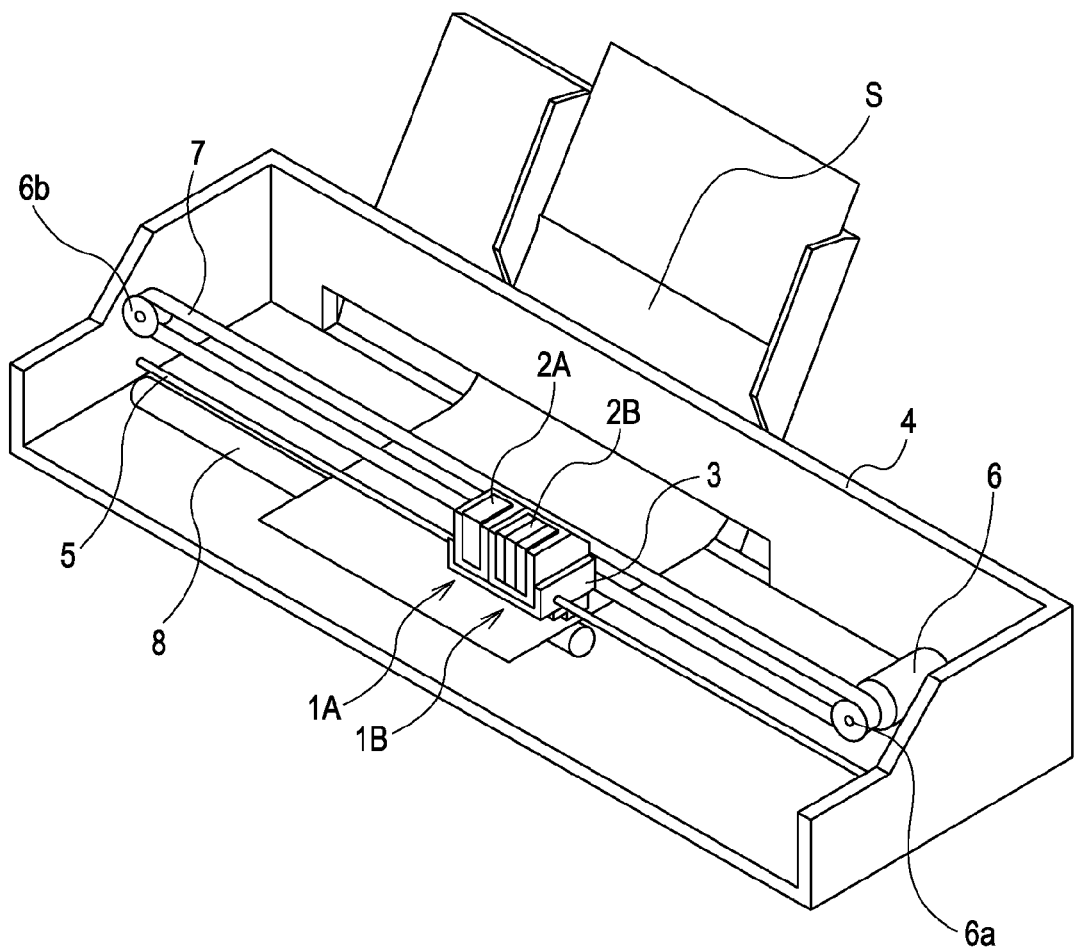
FIG. 19 is a schematic view of a recording apparatus according to an embodiment of the invention.

The ink jet recording head according to an embodiment of the invention can be installed in an ink jet recording apparatus to serve as a part of a recording head unit including flow channels communicating with an ink cartridge or the like. FIG. 19 is a schematic perspective view of such an ink jet recording apparatus.

The ink jet recording apparatus shown in FIG. 19 includes recording head units 1A and 1B each including the ink jet recording head I. Cartridges 2A and 2B for supplying ink are mounted in the respective recoding head units 1A and 1B. The recording head units 1A and 1B are loaded on a carriage 3 secured for movement along a carriage shaft 5 of an apparatus body 4. The recording head units 1A and 1B eject, for example, a black ink composition and a color ink composition, respectively.

The carriage 3 on which the recording head units 1A and 1B are mounted is moved along the carriage shaft 5 by transmitting a driving force from a driving motor 6 to the carriage 3 through a plurality of gears (not shown) and a timing belt 7. In the apparatus body 4, a platen 8 is disposed along the carriage shaft 5 so that a recording sheet S, which is a print medium such as paper, fed from, for example, a feed roller (not shown) is transported over the platen 8.

Although the ink jet record head units 1A and 1B each have one ink jet recording head I in the embodiment shown in FIG. 19, the ink jet record head unit 1A or 1B may have two or more ink jet recording heads without being limited to the above structure.

Although the above embodiment has described an ink jet recording head as the liquid ejecting head, the invention is intended for any type of liquid ejecting head, and may be applied to other liquid ejecting heads that eject liquid other than ink. Other liquid ejecting heads include various types of recording head used in image recording apparatuses such as printers, color material ejecting heads used for manufacturing color filters of liquid crystal displays or the like, electrode material ejecting heads used for forming electrodes of organic EL displays or field emission displays (FEDs), and bioorganic material ejecting heads used for manufacturing biochips.

Since the piezoelectric element of the embodiments of the invention can exhibit a high insulation value and high piezoelectric properties, as described above, it can be used in liquid ejecting heads represented by an ink jet recording head. However, the piezoelectric element can be used in other applications without particular limitation. For example, the piezoelectric element may be applied to ultrasonic devices such as ultrasonic oscillators, ultrasonic motors, piezoelectric transformers, and various types of sensors, such as infrared sensors, ultrasonic sensors, thermal sensors, pressure sensors, and pyroelectric sensors. Also, the piezoelectric element according to an embodiment of the invention may be applied to a ferroelectric element of a ferroelectric memory device or the like.

What is claimed is:

1. A piezoelectric element comprising:
a piezoelectric layer comprising a complex oxide having a perovskite structure with an A site and a B site; and
electrodes provided to the piezoelectric layer,
wherein the complex oxide further contains
a first dopant element that is at least one of magnesium and zinc and
a second dopant element that is cerium;
wherein the A site contains bismuth and the second dopant element, and the B site contains iron and the first dopant element; and
wherein the A site has a defect, and the B site contains bismuth.

2. The piezoelectric element according to claim 1, wherein the complex oxide further contains barium titanate.

3. A liquid ejecting head comprising the piezoelectric element head as set forth in claim 1.

4. A liquid ejecting apparatus comprising the liquid ejecting head as set forth in claim 3.

* * * * *